US011982695B2

(12) United States Patent
Chang et al.

(10) Patent No.: US 11,982,695 B2
(45) Date of Patent: May 14, 2024

(54) TRANSFORMER AREA IDENTIFICATION METHOD AND COMPUTER-READABLE STORAGE MEDIUM

(71) Applicant: BEIJING TENGINEER AIOT TECH CO., LTD., Beijing (CN)

(72) Inventors: Hongshan Chang, Beijing (CN); Guang He, Beijing (CN)

(73) Assignee: BEIJING TENGINEER AIOT TECH CO., LTD., Beijing (CN)

( * ) Notice: Subject to any disclaimer, the term of this patent is extended or adjusted under 35 U.S.C. 154(b) by 295 days.

(21) Appl. No.: 17/594,528

(22) PCT Filed: Apr. 20, 2020

(86) PCT No.: PCT/CN2020/085512
§ 371 (c)(1),
(2) Date: Oct. 21, 2021

(87) PCT Pub. No.: WO2020/221035
PCT Pub. Date: Nov. 5, 2020

(65) Prior Publication Data
US 2022/0196714 A1 Jun. 23, 2022

(30) Foreign Application Priority Data
Apr. 30, 2019 (CN) .......................... 201910357968.2

(51) Int. Cl.
*G01R 22/06* (2006.01)
(52) U.S. Cl.
CPC .................... *G01R 22/061* (2013.01)
(58) Field of Classification Search
CPC .................................................. G01R 22/061
See application file for complete search history.

(56) References Cited

U.S. PATENT DOCUMENTS

2019/0081476 A1* 3/2019 Konya ............. H02J 13/00034

FOREIGN PATENT DOCUMENTS

| CN | 108535543 A | 9/2018 |
| CN | 108683437 A | 10/2018 |

(Continued)

OTHER PUBLICATIONS

He Yu, et al., Research on "Station Area Identification Technology" for Low Voltage Power Consumption, Communication & Information Technology, 2019, pp. 35-39, China Academic Journal Electronic Publishing House.

*Primary Examiner* — Feba Pothen
(74) *Attorney, Agent, or Firm* — Bayramoglu Law Offices LLC (57) ABSTRACT

A transformer area identification method determines a corresponding electric meter mounting relationship by identifying a power jump characteristic based on a power statistic of each node in a power supply network of a transformer area, thereby eliminating the influence of line loss power and increasing identification accuracy. In addition, the identification is performed based on change characteristics of unidentified total power and power of an electric meter in a to-be-identified domain, to reduce interference of a power fluctuation of an identified electric meter to the identification and increase the identification accuracy. Moreover, iterative identification is used, so that the to-be-identified domain is smaller and a convergence speed is faster. The transformer area identification method uses a power jump algorithm to identify the transformer area, thereby eliminating the influence of the line loss power and increasing the identification accuracy.

12 Claims, 6 Drawing Sheets

(56) References Cited

FOREIGN PATENT DOCUMENTS

| | | | | |
|---|---|---|---|---|
| CN | 108805457 | A | 11/2018 | |
| CN | 109066990 | A | 12/2018 | |
| CN | 109217478 | A | 1/2019 | |
| CN | 109256866 | A | 1/2019 | |
| CN | 109444800 | * | 3/2019 | ............ G01R 35/04 |
| CN | 109444800 | A | 3/2019 | |
| CN | 110212518 | A | 9/2019 | |
| WO | 2013033374 | A1 | 3/2013 | |
| WO | 2013033387 | A1 | 3/2013 | |

* cited by examiner

TRANSFORMER AREA IDENTIFICATION METHOD AND COMPUTER-READABLE STORAGE MEDIUM

CROSS REFERENCE TO THE RELATED APPLICATIONS

This application is the national stage entry of International Application No. PCT/CN2020/085512, filed on Apr. 20, 2020, which is based upon and claims priority to Chinese Patent Application No. 201910357968.2 filed on Apr. 30, 2019, the entire contents of which are incorporated herein by reference.

TECHNICAL FIELD

The present disclosure relates to the technical field of smart power grids, and in particular, to a transformer area identification method and a computer-readable storage medium.

BACKGROUND

In a power system, a transformer area is a power supply range or area of a transformer. The transformer area is a term of economic operation and management of electric power. Therefore, an accurate and effective transformer area identification method can significantly improve the efficiency of electric power management.

However, in all existing transformer area identification methods, the transformer area is identified based on the connection of a power supply line when a power grid is installed, but the power supply line may be incorrectly connected, resulting in a wrong transformer area identification result. In addition, the existing transformer area identification methods have poor identification accuracy due to the influence of line loss power, and cannot identify the transformer area quickly and accurately.

At present, no effective solution is proposed to resolve the problem of poor identification accuracy in the existing transformer area identification methods.

SUMMARY

The present disclosure provides a transformer area identification method and a computer-readable storage medium, to resolve the technical problem of poor identification accuracy of existing transformer area identification methods.

According to an aspect of the present disclosure, a transformer area identification method is provided, including the following steps:
  step S1: collecting and counting power of each electric meter in an identification domain and power of a main electric meter, where the identification domain includes a current-state identified domain and a current-state to-be-identified domain, and the current-state identified domain includes a current-state identified inclusive domain and a current-state identified exclusive domain;
  step S2: calculating unidentified total power, where the unidentified total power is a difference between the power of the main electric meter and total power of the current-state identified inclusive domain;
  step S3: calculating a change of the unidentified total power and a change of power of each electric meter in the current-state to-be-identified domain;
  step S4: identifying a transformer area based on the change of the unidentified total power and the change of the power of each electric meter in the current-state to-be-identified domain; and
  step S5: repeating the steps S1 to S4, till the identification domain is divided into a stable-state identified inclusive domain, a stable-state identified exclusive domain, and a stable-state to-be-identified domain.

Further, the step S4 specifically includes the following substeps:
  step S41a: when the unidentified total power fluctuates smoothly, and if power of only one electric meter in the current-state to-be-identified domain jumps effectively, determining the electric meter to be in a suspected exclusive state; and
  step S42a: if a quantity of times that the electric meter is determined to be in the suspected exclusive state exceeds a threshold, removing the electric meter from the current-state to-be-identified domain, and adding the electric meter to the current-state identified exclusive domain.

Further, the step S4 specifically includes the following substeps:
  step S41b: when the unidentified total power jumps effectively, and if power of only one electric meter in the current-state to-be-identified domain jumps effectively and equivalently, determining the electric meter to be in a suspected inclusive state; and
  step S42b: if a quantity of times that the electric meter is determined to be in the suspected inclusive state exceeds a threshold, removing the electric meter from the current-state to-be-identified domain, and adding the electric meter to the current-state identified inclusive domain.

Further, the step S4 further includes the following substep:
  step S43: if a same electric meter is determined to be in the suspected exclusive state and the suspected inclusive state successively, or is determined to be in the suspected inclusive state and the suspected exclusive state successively, resetting the electric meter to be in an initial state.

Further, the transformer area identification method includes the following step:
  step S6: merging adjacent identification domains, and repeating the above steps S1 to S5, till a whole power supply network of the transformer area is completely identified.

Further, the transformer area identification method collects power data based on a pure carrier network.

Further, the transformer area identification method includes the following steps:
  step S7: merging power supply networks of a plurality of transformer areas to form a complete domain, where the complete domain includes a merged identified domain and a merged to-be-identified domain, the merged identified domain is composed of confirmed electric meters in the power supply networks of the transformer areas, and the merged to-be-identified domain is composed of unidentified electric meters;
  step S8: calculating unidentified total power of each power supply network and power of each electric meter in the merged to-be-identified domain; and
  step S9: identifying the transformer area based on a change of the power of each electric meter in the merged to-be-identified domain and a change of the unidentified total power of each power supply network.

Further, the step S9 specifically includes the following substeps:

step S91: if power of only one electric meter in the merged to-be-identified domain jumps effectively and unidentified total power of a power supply network changes accordingly, adding the electric meter to the power supply network;

step S92: if power of a plurality of electric meters in the merged to-be-identified domain jumps effectively in a same direction and unidentified total power of a power supply network changes accordingly, adding these electric meters to the power supply network;

step S93: if power of two electric meters in the merged to-be-identified domain jumps effectively in an opposite direction and unidentified total power of a power supply network changes accordingly in the corresponding direction, adding the two electric meters to corresponding power supply networks based on the corresponding direction; and step S94: if power of one electric meter in the merged to-be-identified domain changes and a change value is greater than a sum of absolute values of power changes of other electric meters, and unidentified total power of a power supply network changes accordingly, adding the electric meter to the power supply network.

Further, the step S1 further includes the following sub-step:

eliminating an empty user whose power is always zero from the identification domain directly.

The present disclosure further provides a computer-readable storage medium storing a computer program for transformer area identification, where the computer program is run on a computer to perform the following steps:

step S1: collecting and counting power of each electric meter in an identification domain and power of a main electric meter, where the identification domain includes a current-state identified domain and a current-state to-be-identified domain, and the current-state identified domain includes a current-state identified inclusive domain and a current-state identified exclusive domain;

step S2: calculating unidentified total power, where the unidentified total power is a difference between the power of the main electric meter and total power of the current-state identified inclusive domain;

step S3: calculating a change of the unidentified total power and a change of power of each electric meter in the current-state to-be-identified domain;

step S4: identifying a transformer area based on the change of the unidentified total power and the change of the power of each electric meter in the current-state to-be-identified domain; and step S5: repeating the steps S1 to S4, till the identification domain is divided into a stable-state identified inclusive domain, a stable-state identified exclusive domain, and a stable-state to-be-identified domain.

The present disclosure has the following beneficial effects.

The transformer area identification method in the present disclosure determines a corresponding electric meter mounting relationship by identifying a power jump characteristic by using a power jump algorithm and based on a power statistic of each node in a power supply network of a transformer area. The identification based on a power jump can minimize the influence of line loss power and increase identification accuracy. In addition, the identification is performed based on change characteristics of unidentified total power and power of an electric meter in a to-be-identified domain, to reduce interference of a power fluctuation of an identified electric meter to the identification and increase the identification accuracy. Moreover, iterative identification is used, so that the to-be-identified domain is smaller and a convergence speed is faster. The transformer area identification method in the present disclosure uses the power jump algorithm to identify the transformer area, thereby eliminating the influence of the line loss power and increasing the identification accuracy. In addition, the transformer area identification method combines iterative identification. As an identification process goes on, the convergence speed is faster, and the identification accuracy is higher.

In addition, the transformer area identification method in the present disclosure uses high-precision time synchronization of a carrier network for the first time, and each carrier module regularly reads the power of its own node, to realize time synchronization of all read data. The carrier module reads the power regularly and adds a timestamp and an electric meter ID to generate power data. The power data is summarized by a concentrator to generate a power statistic for subsequent identification. In addition, the carrier module performs reading the window each time, thereby ensuring delay synchronization between various electric meters and further ensuring the accuracy of transformer area identification.

The present disclosure may have other objectives, features and advantages than the objective, features and advantages as described above. The present disclosure will be further described below in detail with reference to accompanying drawings.

BRIEF DESCRIPTION OF THE DRAWINGS

The accompanying drawings constituting a part of the present disclosure provide a further understanding of the present disclosure. Schematic embodiments of the present disclosure and description thereof are intended to illustrate the present disclosure and do not constitute an undue limitation on the present disclosure. In the accompanying drawings.

DETAILED DESCRIPTION OF THE EMBODIMENTS

The detailed description of the embodiments of the present disclosure is given below with reference to the accompanying drawings, but the present disclosure can be implemented in a plurality of different modes limited and involved in the following.

Figure 1:
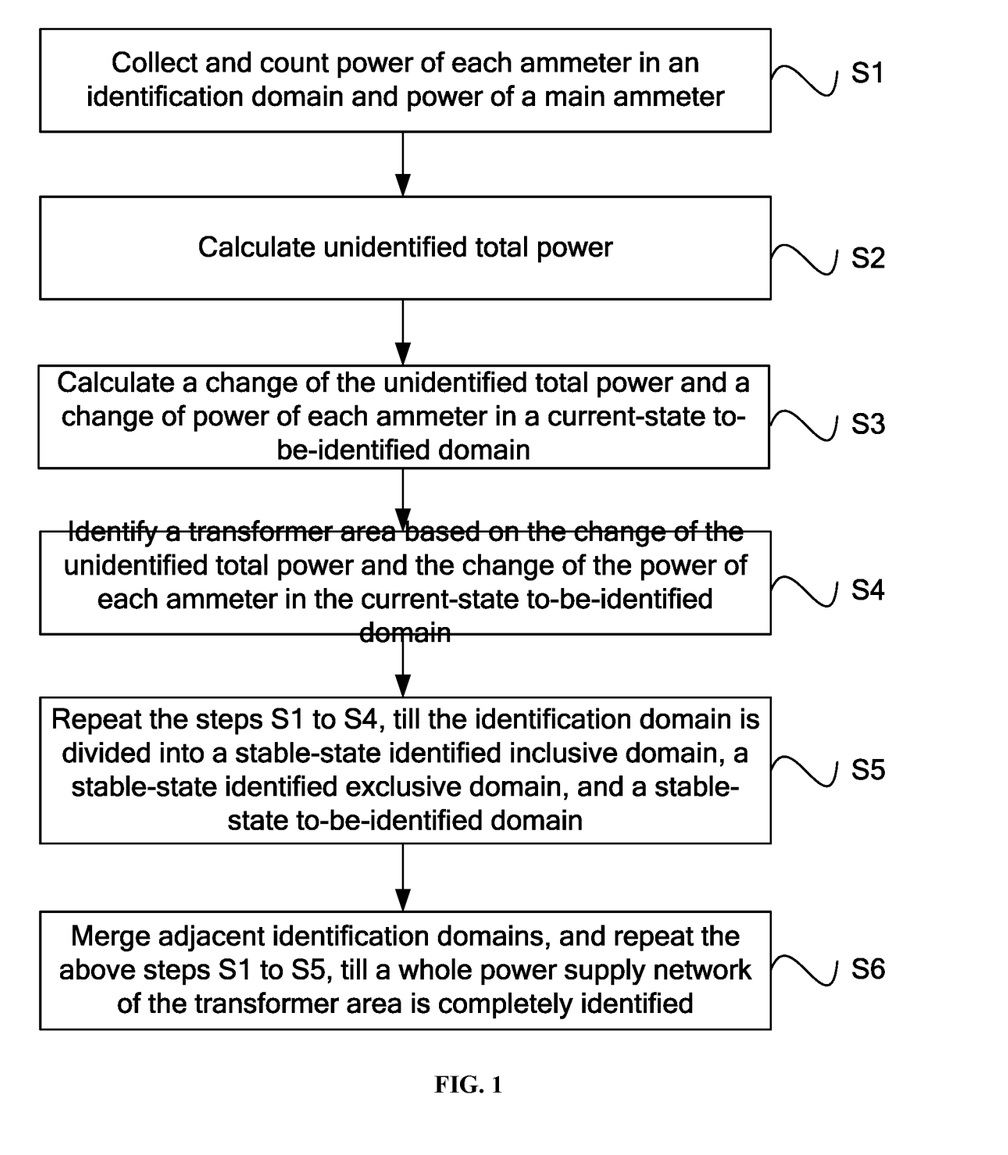
FIG. 1 is a schematic flowchart of a transformer area identification method according to a preferred embodiment of the present disclosure.

As shown in FIG. 1, a preferred embodiment of the present disclosure provides a transformer area identification method. The transformer area identification method uses a power jump algorithm to identify a transformer area, thereby eliminating the influence of line loss power and increasing identification accuracy. In addition, the transformer area identification method combines iterative identification. As an identification process goes on, a convergence speed is faster, and the identification accuracy is higher. The transformer area identification method includes the following steps:

Step S1: Collect and count power of each electric meter in an identification domain and power of a main electric meter, where the identification domain includes a current-state identified domain and a current-state to-be-identified domain, and the current-state identified domain includes a current-state identified inclusive domain and a current-state identified exclusive domain.

Step S2: Calculate unidentified total power, where the unidentified total power is a difference between the power of the main electric meter and total power of the current-state identified inclusive domain.

Step S3: Calculate a change of the unidentified total power and a change of power of each electric meter in the current-state to-be-identified domain.

Step S4: Identify a transformer area based on the change of the unidentified total power and the change of the power of each electric meter in the current-state to-be-identified domain.

Step S5: Repeat the steps S1 to S4, till the identification domain is divided into a stable-state identified inclusive domain, a stable-state identified exclusive domain, and a stable-state to-be-identified domain.

Figure 2:
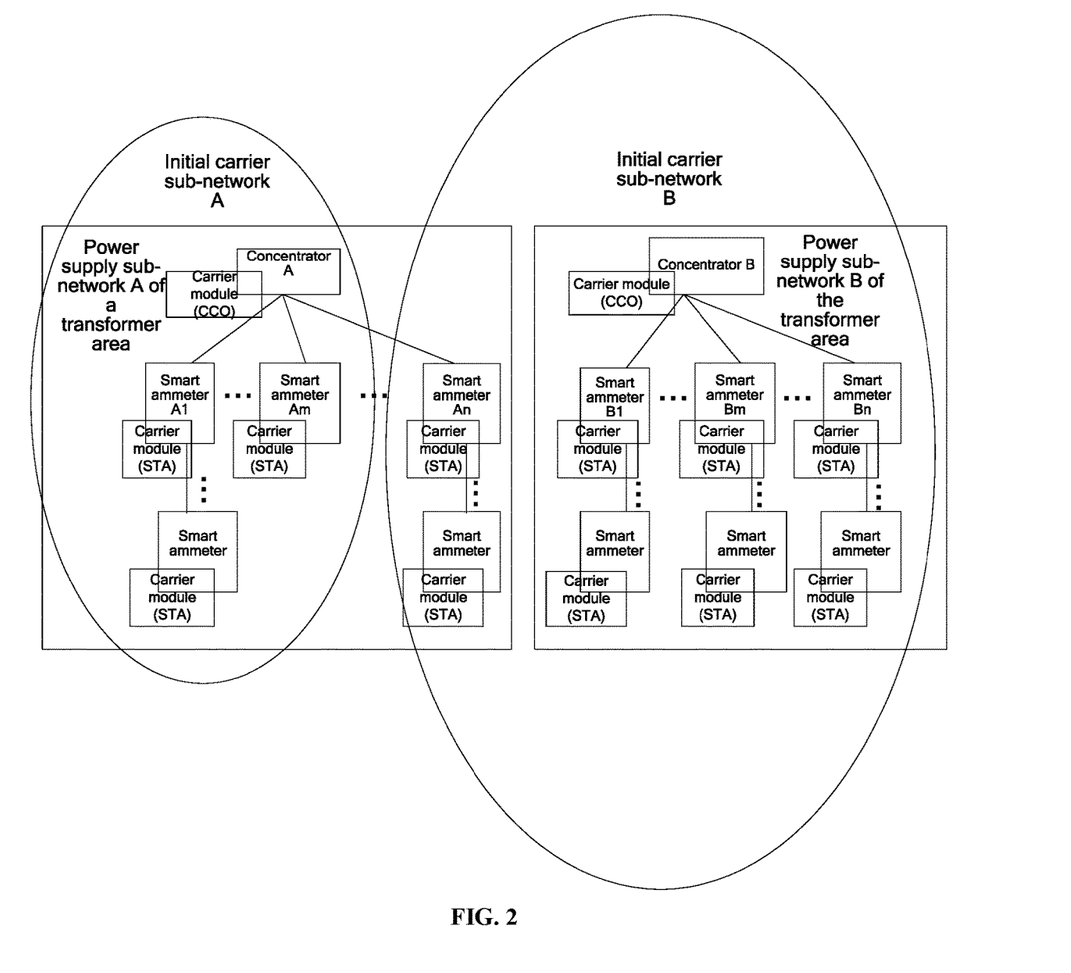
FIG. 2 is a schematic structural diagram of a carrier network and a power supply network that are of a transformer area and on which a transformer area identification method is based according to a preferred embodiment of the present disclosure.

It can be understood that, as shown in FIG. 2, a power supply network of the transformer area includes a plurality of power supply sub-networks of the transformer area. In FIG. 2, only a power supply sub-network A of the transformer area and a power supply sub-network B of the transformer area are shown as an example, and a quantity of power supply sub-networks of the transformer area is not limited herein. The power supply network of the transformer area includes several concentrators (namely, main electric meters) and several smart electric meters. One concentrator is connected to a plurality of smart electric meters by using power supply lines, and one concentrator and a plurality of smart electric meters connected to the concentrator constitute a power supply sub-network of the transformer area. In addition, the concentrators and the smart electric meters each are provided with a carrier module. The carrier module on a concentrator and the carrier module on each smart electric meter connected to the concentrator constitute a carrier sub-network, and each carrier sub-network is an identification domain. A plurality of carrier modules in the carrier sub-network are connected to each other by using a virtual power line carrier (PLC) line. The PLC line does not exist physically, and it is only a logical line, and generated based on a power supply line by using a specific algorithm. However, in practical application, due to various types of interference, a line configuration error may occur, resulting in a transformer area identification error. For example, a smart electric meter An in the power supply sub-network A of the transformer area should belong to the power supply sub-network A of the transformer area. Due to a line configuration error of the carrier network, the smart electric meter An is incorrectly added to the power supply sub-network B of the transformer area during transformer area identification based on the carrier network, resulting in the transformer area identification error. Ideally, the power supply network of the transformer area is consistent with the carrier network of the transformer area. However, in reality, the two networks are different due to various reasons. The transformer area identification method in the present disclosure is a process of deriving an accurate power supply network of the transformer area from an initial carrier network of the transformer area. The transformer area identification method in the present disclosure collects power data based on a pure carrier network. In a broadband carrier system, because all stations (STA) in the whole network are synchronized with network reference time of a gateway (CCO), that is, the carrier module (CCO) of a concentrator and carrier modules (STA) of all electric meters connected to the concentrator by using the carrier network keep synchronization based on the network reference time. Therefore, the power data based on the network reference time of the carrier system is well synchronized, ensuring synchronization and accuracy of power data collection. It can be understood that the carrier module reads real-time power regularly and adds an electric meter ID and an accurate timestamp of the identification domain to generate basic power data.

Preferably, there may be a delay of zero to hundreds of milliseconds between power reading time of an MCU of the electric meter and actual measurement time of a metering chip of the electric meter, and the delay is random for each electric meter. Therefore, it is impossible to keep synchronization of the delay. In the transformer area identification method in the present disclosure, the carrier module performs reading by window each time. For example, a window is three seconds and reading is performed once per second. In this way, three pieces of power data can be read in one round with an interval of 1 second. If the three pieces of data in the current round fluctuate smoothly, an average value can be used for feature matching. If there is a jump in the three pieces of data in the current round, processing is performed according to a pre-determined strategy. The strategy may be discarding the data in the current round or attempting to perform feature matching.

It can be understood that the carrier module of the concentrator acts as a central coordinator of the carrier sub-network, and the carrier module of the smart electric meter acts as a station of the carrier sub-network. The concentrator is a unified electric power data collection device in a power supply sub-network of a transformer area. It can collect power and other electric power data of each electric meter in the network by using the carrier network, and can also measure total power and other electric power data of the whole power supply sub-network of the transformer area.

It can be understood that, in the step S1, power data of each electric meter in one identification domain (namely, power supply sub-network of the transformer area) and power data of the main electric meter (namely, concentrator) are collected by using the concentrator, and the identification domain is divided into the current-state identified domain and the current-state to-be-identified domain, where the current-state identified domain includes the current-state identified inclusive domain and the current-state identified exclusive domain. The current-state identified inclusive domain is composed of electric meters, confirmed to be included in the power supply sub-network of the transformer area, in the identification domain, the current-state identified exclusive domain is composed of electric meters confirmed to be excluded from the power supply sub-network of the transformer area, and the current-state to-be-identified domain is composed of electric meters not identified in the power supply sub-network of the transformer area. It can be also understood that an empty user whose power is always zero is eliminated from the identification domain directly and is not identified, to improve identification efficiency.

It can be understood that, in the step S2, the unidentified total power is equal to a difference between the total power of the power supply sub-network of the transformer area and the total power of the current-state identified inclusive domain, where the total power of the current-state identified inclusive domain is a sum of power of electric meters included in the current-state identified inclusive domain. In addition, the unidentified total power is not a sum of power of electric meters included in the current-state to-be-identified domain.

It can be understood that, in the step S3, the change of the unidentified total power and the change of the power of each electric meter in the current-state to-be-identified domain are calculated based on the power of each electric meter in the identification domain and the power of the main electric meter that are calculated in the step S1.

Figure 3:
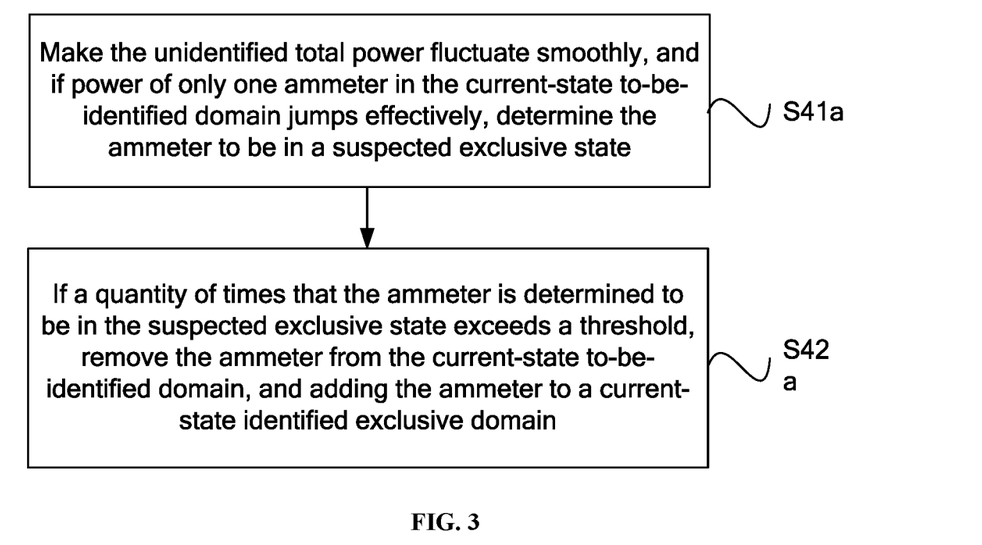
FIG. 3 is a schematic flowchart of step S4 in FIG. 1 according to a preferred embodiment of the present disclosure.

As shown in FIG. 3, it can be understood that the step S4 specifically includes the following substeps:

Step S41a: When the unidentified total power fluctuates smoothly, and if power of only one electric meter in the current-state to-be-identified domain jumps effectively, determine the electric meter to be in a suspected exclusive state.

Step S42a: If a quantity of times that the electric meter is determined to be in the suspected exclusive state exceeds a threshold, remove the electric meter from the current-state to-be-identified domain, and add the electric meter to the current-state identified exclusive domain.

When power changes of two adjacent statistical points of an electric meter are less than a smooth power fluctuation threshold, it is considered that no new electric appliance switching occurs for the electric meter, and in this case, a smooth power fluctuation occurs on the electric meter. When the smooth power fluctuation occurs on the electric meter, it is approximately considered that no power change occurs on the electric meter. When power changes of two adjacent statistical points of an electric meter are greater than an effective power jump threshold, it is considered that identifiable electric appliance switching occurs for the electric meter, and in this case, an effective power jump occurs on the electric meter. To prevent interference from a power fluctuation, the effective power jump threshold should be significantly greater than a sum of smooth power fluctuation thresholds of all electric meters in the current-state to-be-identified domain, and the smooth power fluctuation threshold and the effective power jump threshold can be dynamically adjusted.

It can be understood that, in the step S41a, due to a high reading frequency of the carrier module and a short reading interval, if the unidentified total power fluctuates smoothly, there is a large probability that power of each electric meter not identified in the power supply sub-network of the transformer area fluctuates smoothly. In this case, if power of only one electric meter in the current-state to-be-identified domain jumps effectively, there is a large probability that the electric meter does not belong to the power supply sub-network of the transformer area. This feature is defined as a suspected exclusion feature, and the electric meter is set to the suspected exclusive state.

In the step S42a, if a quantity of times that the suspected exclusion feature occurs on an electric meter is greater than a threshold such as 3 in a statistical process, it is confirmed that the electric meter does not belong to the power supply sub-network of the transformer area. This threshold is defined as an exclusion confirmation threshold, and the electric meter is removed from the current-state to-be-identified domain and added to the current-state identified exclusive domain. The quantity of the times that the suspected exclusion feature occurs is accumulated, and it is confirmed that the electric meter is exclusive when an accumulated quantity is greater the specified threshold, to improve a fault-tolerant capability of a calculation result.

Figure 4:
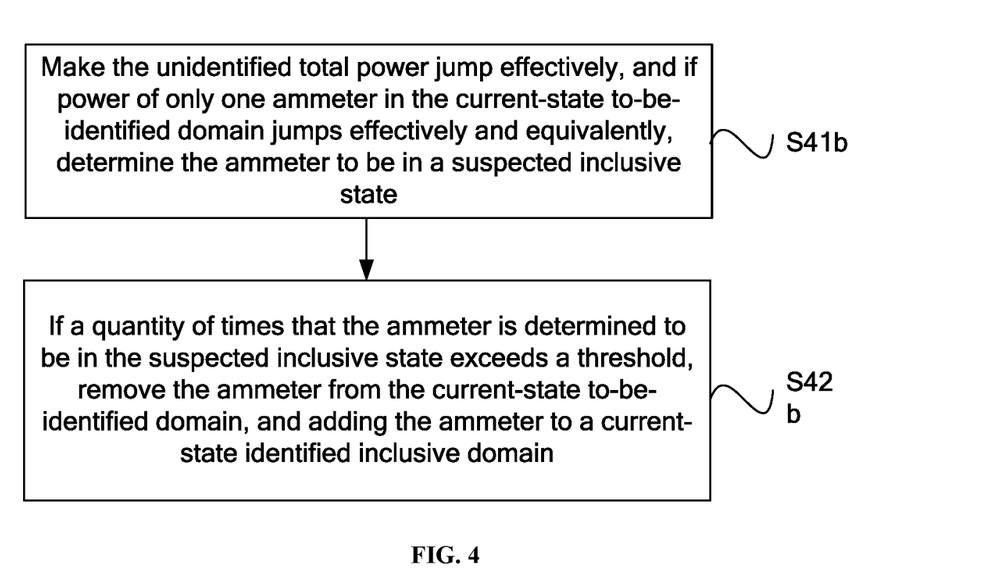
FIG. 4 is a schematic flowchart of step S4 in FIG. 1 according to a preferred embodiment of the present disclosure.

As shown in FIG. 4, it can be understood that the step S4 further includes the following substeps:

Step S41b: When the unidentified total power jumps effectively, and if power of only one electric meter in the current-state to-be-identified domain jumps effectively and approximately equivalently, determine the electric meter to be in a suspected inclusive state.

Step S42b: If a quantity of times that the electric meter is determined to be in the suspected inclusive state exceeds a threshold, remove the electric meter from the current-state to-be-identified domain, and add the electric meter to the current-state identified inclusive domain.

It can be understood that, in the step S41b, the unidentified total power jumps effectively, and in this case, if power of only one electric meter in the current-state to-be-identified domain jumps effectively and approximately equivalently, there is a large probability that the electric meter belongs to the power supply sub-network of the transformer area. This feature is defined as a suspected inclusion feature, and the electric meter is set to the suspected inclusive state.

In the step S42b, if a quantity of times that the suspected inclusion feature occurs on an electric meter is greater than a threshold such as 3 in a statistical process, it is confirmed that the electric meter belongs to the power supply sub-network of the transformer area. This threshold is defined as an inclusion confirmation threshold, and the electric meter is removed from the current-state to-be-identified domain and added to the current-state identified inclusive domain. The quantity of the times that the suspected inclusion feature occurs is accumulated, and it is confirmed that the electric meter is inclusive when an accumulated quantity is greater the specified threshold, to improve the fault-tolerant capability of the calculation result.

It can be understood that the step S4 further includes the following substep:

Step S43: If a same electric meter is determined to be in the suspected exclusive state and the suspected inclusive state successively, or is determined to be in the suspected inclusive state and the suspected exclusive state successively, reset the electric meter to be in an initial state, to prevent misjudgment and ensure accuracy of transformer area identification.

Figure 5:
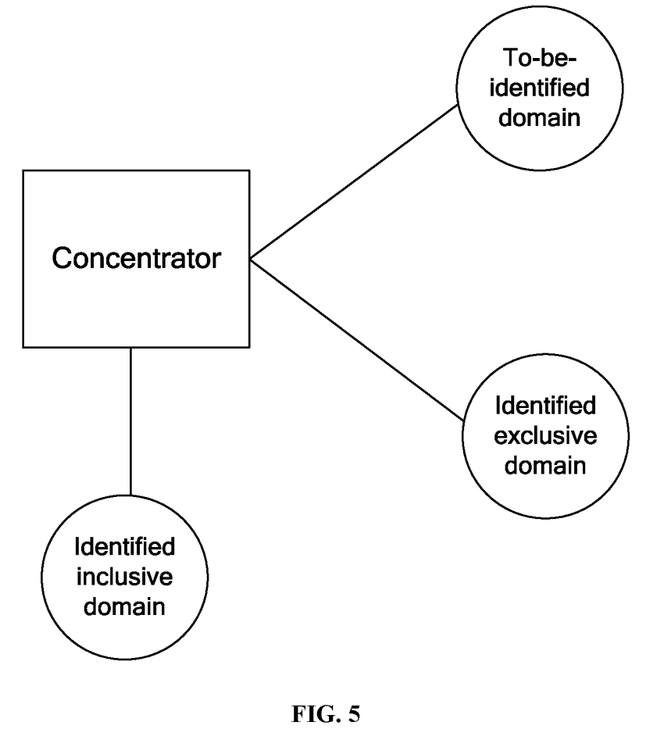
FIG. 5 is a schematic diagram of an identification area obtained after transformer area identification is completed in step S5 in FIG. 1 according to a preferred embodiment of the present disclosure.

As shown in FIG. 5, in the step S5, power jump characteristics including the above suspected exclusion feature and suspected inclusion feature are identified to independently calculate respective identified inclusive domains and identified exclusive domains, and the stable-state identified inclusive domain, the stable-state identified exclusive domain, and the stable-state to-be-identified domain are formed through continuous iteration.

Figure 6:
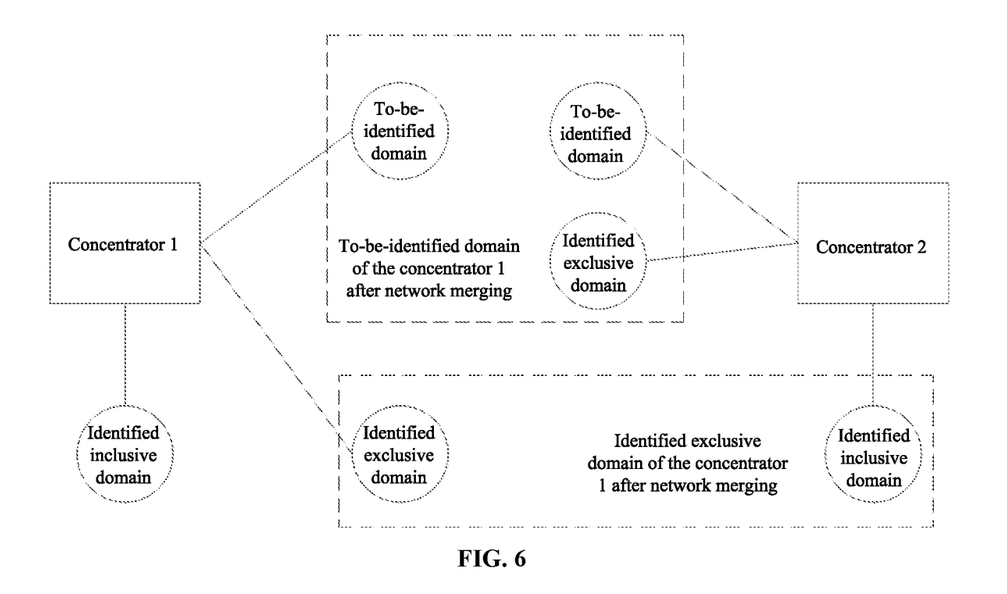
FIG. 6 is a schematic diagram of merging two adjacent identification domains in step S6 in FIG. 1 according to a preferred embodiment of the present disclosure.

As shown in FIG. 1 and FIG. 6, the transformer area identification method further includes the following step:

Step S6: Merge adjacent identification domains, and repeat the above steps S1 to S5, till a whole power supply network of the transformer area is completely identified. After network merging, an identified inclusive domain, an identified exclusive domain, and a to-be-identified domain are formed for each concentrator, and the newly formed to-be-identified domain is identified. Then, adjacent carrier sub-networks are merged repeatedly till the whole power supply network of the transformer area is derived.

Figure 7:
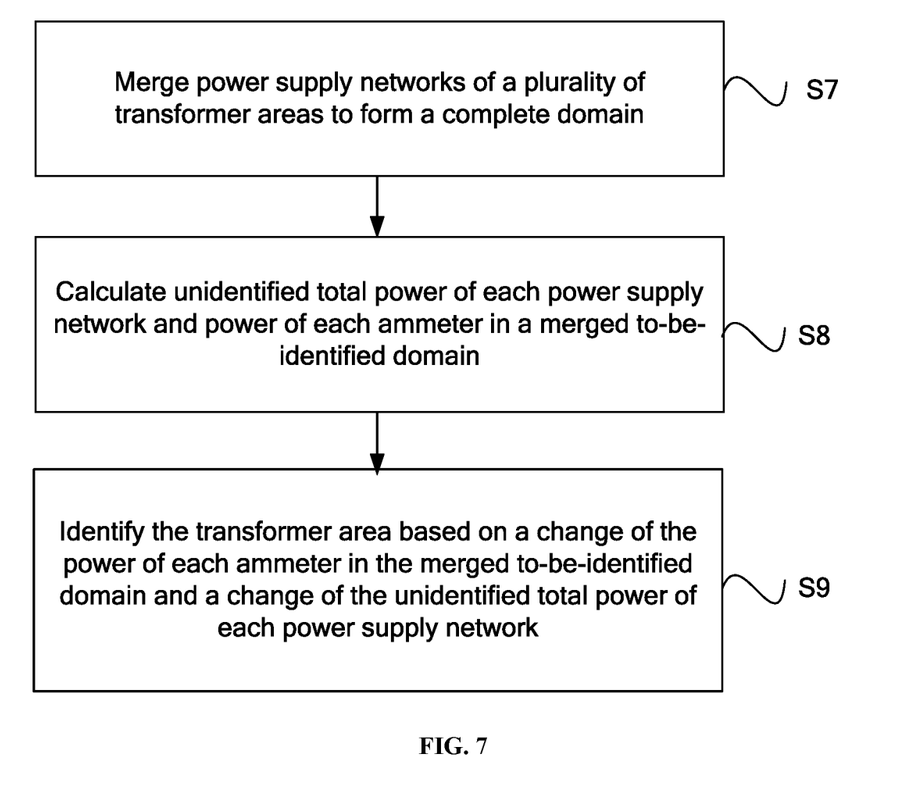
FIG. 7 is a schematic flowchart of a transformer area identification method according to a preferred embodiment of the present disclosure.

As shown in FIG. 7, preferably, the transformer area identification method further includes the following steps:

Step S7: Merge carrier networks of a plurality of transformer areas to form a complete domain, where the complete domain includes a merged identified domain and a merged to-be-identified domain, the merged identified domain is composed of confirmed electric meters in the power supply networks of the transformer areas, and the merged to-be-identified domain is composed of unidentified electric meters.

Step S8: Calculate unidentified total power of each power supply network and power of each electric meter in the merged to-be-identified domain, where the unidentified total power of each power supply network is equal to a difference between total power of the power supply network and a sum of power of electric meters belonging to the power supply network in the merged identified domain.

Step S9: Identify the transformer area based on a change of the power of each electric meter in the merged to-be-identified domain and a change of the unidentified total power of each power supply network.

It can be understood that, in the step S7, if a result of merging carrier networks of two or more transformer areas is consistent with a result of merging power supply networks of the corresponding transformer areas, that is, all electric meters inside the plurality of merged transformer areas are in the identification domain, and none of electric meters outside the plurality of merged transformer areas are in the identification domain, it can be regarded that these carrier networks constitute a complete domain. For the complete domain, a merged network is uniformly identified by using a main station. In addition, when there is a large difference between a sum of total power of the power supply networks and a sum of power of electric meters in a merged identification domain, it means that there is an error in a statistical result, and current data is abandoned. The merged identification domain includes the merged identified domain and the merged to-be-identified domain.

It can be understood that the steps S7, S8, and S9 may be performed independently or may be performed after the step S6.

Figure 8:
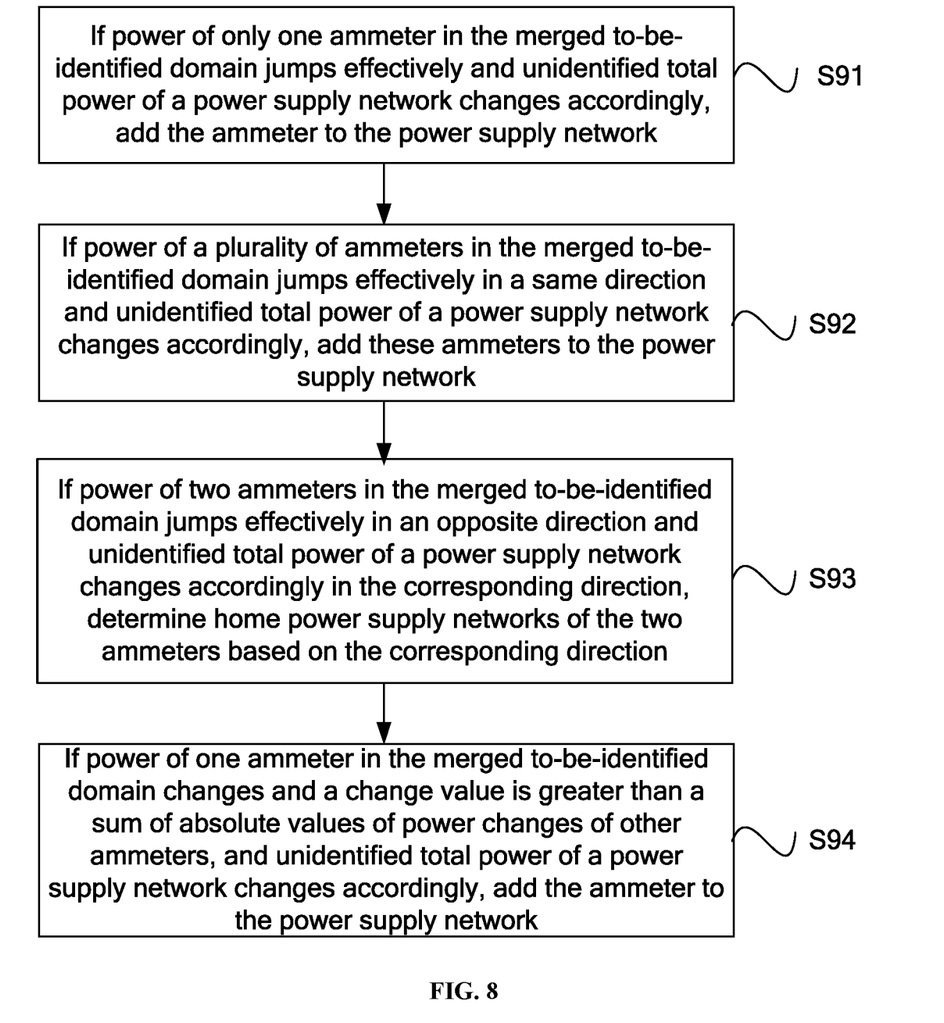
FIG. 8 is a schematic flowchart of step S9 in FIG. 7 according to a preferred embodiment of the present disclosure.

It can be understood that, as shown in FIG. 8, the step S9 specifically includes the following substeps:

Step S91: If power of only one electric meter in the merged to-be-identified domain jumps effectively and unidentified total power of a power supply network changes accordingly, add the electric meter to the power supply network.

Step S92: If power of a plurality of electric meters in the merged to-be-identified domain jumps effectively in a same direction and unidentified total power of a power supply network changes accordingly, add these electric meters to the power supply network.

Step S93: If power of two electric meters in the merged to-be-identified domain jumps effectively in an opposite direction and unidentified total power of a power supply network changes accordingly in the corresponding direction, add the two electric meters to corresponding power supply networks based on the corresponding direction.

Step S94: If power of one electric meter in the merged to-be-identified domain changes and a change value is obviously greater than a sum of absolute values of power changes of other electric meters, and unidentified total power of a power supply network changes accordingly, add the electric meter to the power supply network.

The transformer area identification method in the present disclosure determines a corresponding electric meter mounting relationship by identifying a power jump characteristic by using a power jump algorithm and based on a power statistic of each node in a power supply network of a transformer area. The identification based on a power jump can minimize the influence of line loss power and increase identification accuracy. In addition, the identification is performed based on change characteristics of unidentified total power and power of an electric meter in a to-be-identified domain, to reduce interference of a power fluctuation of an identified electric meter to the identification and increase the identification accuracy. Moreover, iterative identification is used, so that the to-be-identified domain is smaller and a convergence speed is faster. The transformer area identification method in the present disclosure uses the power jump algorithm to identify the transformer area, thereby eliminating the influence of the line loss power and increasing the identification accuracy. In addition, the transformer area identification method combines iterative identification. As an identification process goes on, the convergence speed is faster, and the identification accuracy is higher.

In addition, the transformer area identification method in the present disclosure uses high-precision time synchronization of a carrier network for the first time, and each carrier module regularly reads power of its own node, to realize time synchronization of all read data. The carrier module reads the power regularly, and adds a timestamp and an electric meter ID to generate power data. The power data is summarized by a concentrator to generate a power statistic for subsequent identification. In addition, the carrier module performs reading by window each time, thereby ensuring delay synchronization between various electric meters and further ensuring accuracy of transformer area identification.

Another embodiment of the present disclosure provides a computer-readable storage medium storing a computer program for transformer area identification, where the computer program is run on a computer to perform the following steps:

Step S1: Collect and count power of each electric meter in an identification domain and power of a main electric meter, where the identification domain includes a current-state identified domain and a current-state to-be-identified domain, and the current-state identified domain includes a current-state identified inclusive domain and a current-state identified exclusive domain.

Step S2: Calculate unidentified total power, where the unidentified total power is a difference between the power of the main electric meter and total power of the current-state identified inclusive domain.

Step S3: Calculate a change of the unidentified total power and a change of power of each electric meter in the current-state to-be-identified domain.

Step S4: Identify a transformer area based on the change of the unidentified total power and the change of the power of each electric meter in the current-state to-be-identified domain.

Step S5: Repeat the steps S1 to S4, till the identification domain is divided into a stable-state identified inclusive domain, a stable-state identified exclusive domain, and a stable-state to-be-identified domain.

It can be understood that the step S4 preferably includes the following substeps:

Step S41a: When the unidentified total power fluctuates smoothly, and if power of only one electric meter in the current-state to-be-identified domain jumps effectively, determine the electric meter to be in a suspected exclusive state.

Step S42a: If a quantity of times that the electric meter is determined to be in the suspected exclusive state exceeds a threshold, remove the electric meter from the current-state to-be-identified domain, and add the electric meter to the current-state identified exclusive domain.

It can be understood that the step S4 further includes the following substeps:

Step S41b: When the unidentified total power jumps effectively, and if power of only one electric meter in the current-state to-be-identified domain jumps effectively and approximately equivalently, determine the electric meter to be in a suspected inclusive state.

Step S42b: If a quantity of times that the electric meter is determined to be in the suspected inclusive state exceeds a threshold, remove the electric meter from the current-state to-be-identified domain, and add the electric meter to the current-state identified inclusive domain.

It can be understood that the step S4 further includes the following substep:

Step S43: If a same electric meter is determined to be in the suspected exclusive state and the suspected inclusive state successively, or is determined to be in the suspected inclusive state and the suspected exclusive state successively, reset the electric meter to be in an initial state, to prevent misjudgment and ensure accuracy of transformer area identification.

It can be understood that the computer program is run on the computer to further perform the following step:

Step S6: Merge adjacent identification domains, and repeat the above steps S1 to S5, till a whole power supply network of the transformer area is completely identified.

It can be understood that the computer program is run on the computer to further perform the following steps:

Step S7: Merge power supply networks of a plurality of transformer areas to form a complete domain, where the complete domain includes a merged identified domain and a merged to-be-identified domain, the merged identified domain is composed of confirmed electric meters in the power supply networks of the transformer areas, and the merged to-be-identified domain is composed of unidentified electric meters.

Step S8: Calculate unidentified total power of each power supply network and power of each electric meter in the merged to-be-identified domain, where the unidentified total power of each power supply network is equal to a difference between total power of the power supply network and a sum of power of electric meters belonging to the power supply network in the merged identified domain.

Step S9: Identify the transformer area based on a change of the power of each electric meter in the merged to-be-identified domain and a change of the unidentified total power of each power supply network.

It can be understood that the step S9 specifically includes the following substeps:

Step S91: If power of only one electric meter in the merged to-be-identified domain jumps effectively and unidentified total power of a power supply network changes accordingly, add the electric meter to the power supply network.

Step S92: If power of a plurality of electric meters in the merged to-be-identified domain jumps effectively in a same direction and unidentified total power of a power supply network changes accordingly, add these electric meters to the power supply network.

Step S93: If power of two electric meters in the merged to-be-identified domain jumps effectively in an opposite direction and unidentified total power of a power supply network changes accordingly in the corresponding direction, add the two electric meters to corresponding power supply networks based on the corresponding direction.

Step S94: If power of one electric meter in the merged to-be-identified domain changes and a change value is obviously greater than a sum of absolute values of power changes of other electric meters, and unidentified total power of a power supply network changes accordingly, add the electric meter to the power supply network.

Generally, a computer-readable medium may be in the following form: a floppy disk, a flexible disk, a hard disk, a magnetic tape, any other type of magnetic medium, a CD-ROM, any other type of optical medium, a punch card, a paper tape, any other type of physical medium with a hole pattern, a random access memory (RAM), a programmable read-only memory (PROM), an erasable programmable read-only memory (EPROM), a flash erasable programmable read-only memory (FLASH-EPROM), any other type of memory chip or cartridge, or any other type of medium that can be read by a computer. An instruction can be further transmitted or received by a transmission medium. The transmission medium may include any tangible or intangible medium. The transmission medium can be used to store, encode or carry an instruction to be executed by a machine, and includes a digital or analog communication signal or an intangible medium that facilitates communication with the above instruction. The transmission medium includes a coaxial cable, a copper wire, and an optical fiber, and includes a conductive wire of a bus used to transmit a computer data signal.

The above description is merely preferred embodiments of the present disclosure and is not intended to limit the present disclosure, and various changes and modifications may be made by those skilled in the art. Any modifications, equivalent substitutions, improvements, and the like made within the spirit and principle of the present disclosure should be included within the protection scope of the present disclosure.

What is claimed is:

1. A transformer area identification method, comprising the following steps:
   step S1: collecting and counting power of each first electric meter, of a plurality of first electric meters, in an identification domain and power of a main electric meter, wherein the identification domain comprises a current-state identified domain and a current-state to-be-identified domain, and the current-state identified domain comprises a current-state identified inclusive domain and a current-state identified exclusive domain;
   step S2: calculating unidentified total power, wherein the unidentified total power is a difference between the power of the main electric meter and total power of the current-state identified inclusive domain;

step S3: calculating a change of the unidentified total power and a change of power of each second electric meter, of a plurality of second electric meters, in the current-state to-be-identified domain;

step S4: identifying a transformer area based on the change of the unidentified total power and the change of the power of the each second electric meter in the current-state to-be-identified domain; and step S5: repeating steps S1 to S4, till the identification domain is divided into a stable-state identified inclusive domain, a stable-state identified exclusive domain, and a stable-state to-be-identified domain, wherein step S4 specifically comprises the following substeps:

step S41a: when the unidentified total power fluctuates smoothly, if power of only one second electric meter in the current-state to-be-identified domain jumps effectively, determining the only one second electric meter to be in a suspected exclusive state; and step S42a: if a quantity of times that the only one second electric meter is determined to be in the suspected exclusive state exceeds a threshold, removing the only one second electric meter from the current-state to-be-identified domain, and adding the only one second electric meter to the current-state identified exclusive domain, step S41b: when the unidentified total power jumps effectively, if power of only one second electric meter in the current-state to-be-identified domain jumps effectively and equivalently, determining the only one second electric meter to be in a suspected inclusive state; and step S42b: if a quantity of times that the only one second electric meter is determined to be in the suspected inclusive state exceeds a threshold, removing the only one second electric meter from the current-state to-be-identified domain, and adding the only one second electric meter to the current-state identified inclusive domain, step S43: if a same electric meter is determined to be in the suspected exclusive state and the suspected inclusive state successively, or is determined to be in the suspected inclusive state and the suspected exclusive state successively, resetting the same electric meter to be in an initial state.

2. The transformer area identification method according to claim 1, wherein the transformer area identification method further comprises the following step:

step S6: merging adjacent identification domains, and repeating steps S1 to S5, till a whole power supply network of the transformer area is completely identified.

3. The transformer area identification method according to claim 1, wherein the transformer area identification method collects power data based on a pure carrier network.

4. The transformer area identification method according to claim 1, wherein the transformer area identification method further comprises the following steps:

step S7: merging power supply networks of a plurality of transformer areas to form a complete domain, wherein the complete domain comprises a merged identified domain and a merged to-be-identified domain, the merged identified domain is composed of confirmed electric meters in the power supply networks of the plurality of transformer areas, and the merged to-be-identified domain is composed of unidentified electric meters;

step S8: calculating unidentified total power of each power supply network and power of each third electric meter in the merged to-be-identified domain; and step S9: identifying the transformer area based on a change of the power of each third electric meter in the merged to-be-identified domain and a change of the unidentified total power of each power supply network.

5. The transformer area identification method according to claim 4, wherein step S9 specifically comprises the following substeps:

step S91: if power of only one third electric meter in the merged to-be-identified domain jumps effectively and unidentified total power of a first power supply network changes accordingly, adding the only one third electric meter to the first power supply network;

step S92: if power of a plurality of third electric meters in the merged to-be-identified domain jumps effectively in a same direction and unidentified total power of a second power supply network changes accordingly, adding the plurality of third electric meters to the second power supply network;

step S93: if power of two third electric meters in the merged to-be-identified domain jumps effectively in an opposite direction and unidentified total power of a power supply network changes accordingly in a corresponding direction, adding the two third electric meters to corresponding power supply networks based on the corresponding direction; and step S94: if power of one third electric meter in the merged to-be-identified domain changes and a change value is greater than a sum of absolute values of power changes of other electric meters, and unidentified total power of a third power supply network changes accordingly, adding the one third electric meter to the third power supply network.

6. The transformer area identification method according to claim 1, wherein step S1 further comprises the following substep:

eliminating an empty user from the identification domain directly, wherein power of the empty user is zero.

7. A non-transitory computer-readable storage medium storing a computer program for transformer area identification, wherein the computer program is run on a computer to perform the following steps:

step S1: collecting and counting power of each first electric meter, of a plurality of first electric meters, in an identification domain and power of a main electric meter, wherein the identification domain comprises a current-state identified domain and a current-state to-be-identified domain, and the current-state identified domain comprises a current-state identified inclusive domain and a current-state identified exclusive domain;

step S2: calculating unidentified total power, wherein the unidentified total power is a difference between the power of the main electric meter and total power of the current-state identified inclusive domain;

step S3: calculating a change of the unidentified total power and a change of power of each second electric meter, of a plurality of second electric meters, in the current-state to-be-identified domain;

step S4: identifying a transformer area based on the change of the unidentified total power and the change of the power of each second electric meter in the current-state to-be-identified domain; and step S5: repeating steps S1 to S4, till the identification domain is divided into a stable-state identified inclusive domain, a stable-state identified exclusive domain, and a stable-state to-be-identified domain, wherein step S4 specifically comprises the following substeps:

step S41a: when the unidentified total power fluctuates smoothly, if power of only one second electric meter in the current-state to-be-identified domain jumps effectively, determining the only one second electric meter to be in a suspected exclusive state; and step S42a: if a quantity of times that the only one second electric meter is determined to be in the suspected exclusive state exceeds a threshold, removing the only one second electric meter from the current-state to-be-identified domain, and adding the only one second electric meter to the current-state identified exclusive domain, step S41b: when the unidentified total power jumps effectively, if power of only one second electric meter in the current-state to-be-identified domain jumps effectively and equivalently, determining the only one second electric meter to be in a suspected inclusive state; and step S42b: if a quantity of times that the only one second electric meter is determined to be in the suspected inclusive state exceeds a threshold, removing the only one second electric meter from the current-state to-be-identified domain, and adding the only one second electric meter to the current-state identified inclusive domain, step S43: if a same electric meter is determined to be in the suspected exclusive state and the suspected inclusive state successively, or is determined to be in the suspected inclusive state and the suspected exclusive state successively, resetting the same electric meter to be in an initial state.

8. A transformer area identification method, comprising the following steps:

step S1: collecting and counting power of each first electric meter, of a plurality of first electric meters, in an identification domain and power of a main electric meter, wherein the identification domain comprises a current-state identified domain and a current-state to-be-identified domain, and the current-state identified domain comprises a current-state identified inclusive domain and a current-state identified exclusive domain;

step S2: calculating unidentified total power, wherein the unidentified total power is a difference between the power of the main electric meter and total power of the current-state identified inclusive domain;

step S3: calculating a change of the unidentified total power and a change of power of each second electric meter, of a plurality of second electric meters, in the current-state to-be-identified domain;

step S4: identifying a transformer area based on the change of the unidentified total power and the change of the power of the each second electric meter in the current-state to-be-identified domain; and step S5: repeating steps S1 to S4, till the identification domain is divided into a stable-state identified inclusive domain, a stable-state identified exclusive domain, and a stable-state to-be-identified domain, wherein the transformer area identification method further comprises the following steps:

step S7: merging power supply networks of a plurality of transformer areas to form a complete domain, wherein the complete domain comprises a merged identified domain and a merged to-be-identified domain, the merged identified domain is composed of confirmed electric meters in the power supply networks of the plurality of transformer areas, and the merged to-be-identified domain is composed of unidentified electric meters;

step S8: calculating unidentified total power of each power supply network and power of each third electric meter in the merged to-be-identified domain; and step S9: identifying the transformer area based on a change of the power of each third electric meter in the merged to-be-identified domain and a change of the unidentified total power of each power supply network, wherein step S9 specifically comprises the following substeps:

step S91: if power of only one third electric meter in the merged to-be-identified domain jumps effectively and unidentified total power of a first power supply network changes accordingly, adding the only one third electric meter to the first power supply network;

step S92: if power of a plurality of third electric meters in the merged to-be-identified domain jumps effectively in a same direction and unidentified total power of a second power supply network changes accordingly, adding the plurality of third electric meters to the second power supply network;

step S93: if power of two third electric meters in the merged to-be-identified domain jumps effectively in an opposite direction and unidentified total power of a power supply network changes accordingly in a corresponding direction, adding the two third electric meters to corresponding power supply networks based on the corresponding direction; and step S94: if power of one third electric meter in the merged to-be-identified domain changes and a change value is greater than a sum of absolute values of power changes of other electric meters, and unidentified total power of a third power supply network changes accordingly, adding the one third electric meter to the third power supply network.

9. The transformer area identification method according to claim 8, wherein the transformer area identification method further comprises the following step:

step S6: merging adjacent identification domains, and repeating steps S1 to S5, till a whole power supply network of the transformer area is completely identified.

10. The transformer area identification method according to claim 8, wherein the transformer area identification method collects power data based on a pure carrier network.

11. The transformer area identification method according to claim 1, wherein step S1 further comprises the following substep:

eliminating an empty user from the identification domain directly, wherein power of the empty user is zero.

12. The transformer area identification method according to claim 1, wherein step S4 specifically comprises the following substeps:

step S41*a*: when the unidentified total power fluctuates smoothly, if power of only one second electric meter in the current-state to-be-identified domain jumps effectively, determining the only one second electric meter to be in a suspected exclusive state; and step S42*a*: if a quantity of times that the only one second electric meter is determined to be in the suspected exclusive state exceeds a threshold, removing the only one second electric meter from the current-state to-be-identified domain, and adding the only one second electric meter to the current-state identified exclusive domain, step S41*b*: when the unidentified total power jumps effectively, if power of only one second electric meter in the current-state to-be-identified domain jumps effectively and equivalently, determining the only one second electric meter to be in a suspected inclusive state; and step S42*b*: if a quantity of times that the only one second electric meter is determined to be in the suspected inclusive state exceeds a threshold, removing the only one second electric meter from the current-state to-be-identified domain, and adding the only one second electric meter to the current-state identified inclusive domain, step S43: if a same electric meter is determined to be in the suspected exclusive state and the suspected inclusive state successively, or is determined to be in the suspected inclusive state and the suspected exclusive state successively, resetting the same electric meter to be in an initial state.

* * * * *